(12) United States Patent
Karnowka et al.

(10) Patent No.: US 6,522,032 B1
(45) Date of Patent: Feb. 18, 2003

(54) ELECTRICAL SWITCH AND METHOD OF GENERATING AN ELECTRICAL SWITCH OUTPUT SIGNAL

(75) Inventors: Thomas P. Karnowka, Littleton, CO (US); David A. Easter, Arvada, CO (US); Timothy N. Teen, Belleville, NJ (US); Douglas K. Milby, Arvada, CO (US); Armand Rozenberg, Rehovoth (IL)

(73) Assignee: Easter-Owen Electric Company, Arvada, CO (US)

( * ) Notice: Subject to any disclaimer, the term of this patent is extended or adjusted under 35 U.S.C. 154(b) by 0 days.

(21) Appl. No.: 09/552,837

(22) Filed: Apr. 20, 2000

Related U.S. Application Data

(60) Provisional application No. 60/133,002, filed on May 7, 1999.

(51) Int. Cl.[7] ............................................... H01H 35/00
(52) U.S. Cl. ....................................... 307/119; 307/118
(58) Field of Search ................................ 307/118, 116, 307/144, 112, 119; 310/338, 339, 340, 345

(56) References Cited

U.S. PATENT DOCUMENTS

| | | | | |
|---|---|---|---|---|
| 4,378,552 A | | 3/1983 | Jalbert | 341/30 |
| 4,618,797 A | * | 10/1986 | Cline | 310/339 |
| 4,852,442 A | | 8/1989 | Pottorff | 83/697 |
| 5,332,944 A | * | 7/1994 | Cline | 310/339 |
| 5,336,959 A | | 8/1994 | Park et al. | 310/328 |
| 5,442,150 A | | 8/1995 | Ipcinski | 200/181 |
| 5,508,700 A | | 4/1996 | Taylor et al. | 341/33 |
| 5,636,729 A | | 6/1997 | Wiciel | 200/181 |
| 5,789,844 A | | 8/1998 | de Groot | 341/30 |
| 6,429,548 B1 | * | 8/2002 | Wagner et al. | 307/118 |

* cited by examiner

Primary Examiner—Edward H. Tso
Assistant Examiner—Lawrence Luk

(57) ABSTRACT

An electrical switch and a method of generating an electrical switch output signal. An electric switch senses both pressure placed upon the switch's surface and the contact of the object exerting the pressure on the switch. When both conditions exist, the switch is activated. The electrical switch may employ a piezoelectric element to recognize the application of pressure, a capacitive sensing circuit to recognize the presence of an object applying the pressure, and a microcontroller circuit to control output switch circuity upon satisfaction of both conditions precedent. The electrical switch can be configured to provide a continuous output signal for the duration that the switch is pressed after the conditions are satisfied or to switch between open and closed states each time the switch is pressed after the conditions are satisfied.

34 Claims, 4 Drawing Sheets

ELECTRICAL SWITCH AND METHOD OF GENERATING AN ELECTRICAL SWITCH OUTPUT SIGNAL

This application is based upon a provisional application filed on May 7, 1999 with a Ser. No. 60/133,002, and is hereby incorporated by reference.

BACKGROUND OF THE INVENTION

The present invention relates to electric switches, and more particularly pertains to an improved piezoelectric switch incorporating a unique system of discerning between deliberate touch activation and various other false trigger possibilities which can provide information concerning the duration of the activating contact.

Mechanical activated switches provide switch control capabilities,but are affected by environmental factors such as extreme temperature variations and moisture and are subject to degradation due to wear, which can limit such switch's life and effectiveness. Non-mechanical, electrical switches, like piezoelectric switches, avoid the life limiting wear characteristics inherent to mechanical switches, but are subject to false activation.

The present invention provides an improved electrical switch which possesses the ability to detect the occurrence of when an object such as a human finger applies pressure to the switch and the ability to monitor the duration of the presence of such object in contact with the switch. The present invention, therefore, can provide a relatively accurate, controlled means of discerning between intentional switch actuation and anomalies which might cause unintentional activation as well as provide an accurate measure of the duration of the switch activation contact.

The present invention is broad enough to contemplate an electrical switch which monitors two separate conditions. The preferred embodiment, described in detail subsequent, monitors actuation pressure applied to the switch and capacitive change in the switch's case caused by contact with a conductive object, such as a human finger. By requiring these separate conditions precedent, the switch avoids actuation by pressure placed upon the switch inadvertently, such as by incidental contact or by sound waves or atmospheric variations, and avoids actuation by only conductive contact with the switch, such as by contact with inadvertent liquid spills, humidity, or rain.

SUMMARY OF THE INVENTION

The present invention contemplates an electrical switch and a method of generating an electrical switch output signal. The electric switch senses both pressure placed upon the switch's surface and the contact of the object exerting the pressure on the switch. When both conditions exist, the switch is activated. The electrical switch may employ a piezoelectric element to recognize the application of pressure, a capacitive sensing circuit to recognize the presence of an object applying the pressure, and a microcontroller circuit to control output switch circuity upon satisfaction of both conditions precedent. The electrical switch can be configured to provide a continuous output signal for the duration that the switch is pressed after the conditions are satisfied or to switch between open and closed states each time the conditions are satisfied While the above are important features of the invention, there are, of course additional features of the invention that will be described hereinafter and which will form the subject matter of the claims appended hereto. In this respect, before explaining at least one preferred embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting. As such, those skilled in the art will appreciate that the conception, upon which the disclosure is based, may readily be utilized as a basis for the designing of other structures, methods, or systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The foregoing features of the present invention will be more readily understood by reference to the following detailed description taken with the accompanying drawings, in which.

DETAILED DESCRIPTION OF THE PREFERRED EMBODIMENTS

Figure 1:
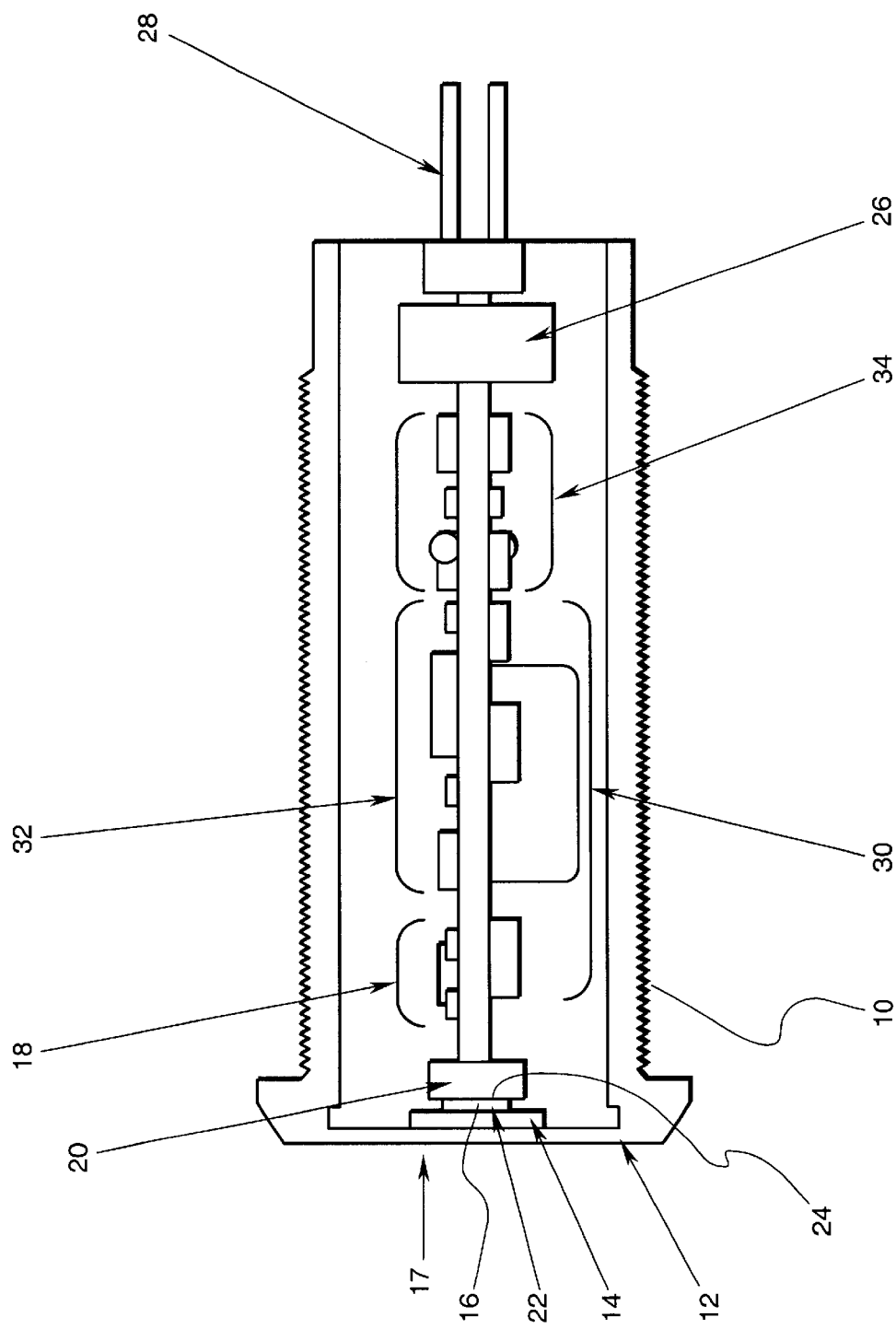
FIG. 1 is a longitudinal cross-sectional, schematic view of an electrical switch according to one embodiment of the present invention.

The present invention will be described with reference to the accompanying drawings wherein like reference numerals refer to the same item.

There is shown in FIG. 1 an electrical switch according to one embodiment of the present invention. The switch includes a substantially cylindrical, conductive case 10 possessing a closed distal end cap 12 and a series of threads about the external peripheral surface to permit installation of the switch in a correspondingly threaded aperture in a wall, plate, or other mounting structure. Thus, the switch may be adapted for a wide range of applications in a wide variety of mounting structures. While the preferred embodiment is depicted as a threaded cylindrical conductive case, the present invention contemplates cases of various shapes and sizes as well as a variety of installation means other than those depicted in FIG. 1.

The closed distal end cap 12 of the case 10 is sufficiently pliant and elastic to bend slightly (to a deformity of approximately two or more microns) when the end cap 12 receives pressure input such as is generated by a person's finger. Standard human finger pressure is in the range of three to five Newtons. The distal end cap 12, therefore, is made of a material and is of a corresponding thickness which can be deflected two or more microns by ordinary human finger pressure. In the preferred embodiment described herein, the closed distal end cap 12 of the case 10 may be integrally formed with the case 10, but need not be. The case 10 may be fashioned of a conductive material such as aluminum, stainless steel, brass, or any other equivalent rigid, semirigid, or non-rigid conductive material. The cap 12 may be fashioned of a material which is either the same as or different from that forming the case 10. The preferred embodiment uses a cap 12 that can be deflected as described previously, however, the invention broadly contemplates other means of transmitting pressure information such as push buttons acting against a compression spring or similar means. A support frame 14 is mounted to the interior surface of the distal end cap 12 and holds a piezoelectric element 16 having a contact surface 22 in contact with the distal end cap 12, whereby pressure applied to the distal end cap 12 in the direction of arrow 17 shown in FIG. 1 is transmitted to the piezoelectric element 16. The support frame may be fashioned from any non-conductive material such as plastic, rubber or glass. When pressure is applied to the contact surface 22 of piezoelectric element 16, the element flexes, whereby surface charges are induced by the piezoelectric element's dielectric displacement, and an electrical field is built up within the piezoelectric element 16. Typical piezoelectric elements require being flexed less than two microns to generate such an electric field. Therefore, the pressure transmitted to flex the piezoelectric element need only be slight.

The electric field within the piezoelectric element 16 is transformed into electric voltage on the element's voltage transmission surface 24. This voltage is transmitted to piezo signal conditioning circuitry 18 by flexible leadless conductor pad 20. The preferred embodiment utilizes an anisotropic electrical conductive rubber. The invention, however, contemplates connecting the piezoelectric element 16 to the piezoelectric conditioning circuitry by any electrically conductive means. The transmitted voltage is received by piezo signal conditioning circuitry 18, which upon receipt of the transmitted voltage, generates a control signal, which signal is transmitted to the microcontroller circuitry 32. This signal indicates to the microcontroller that pressure is applied to the distal end cap 12 of the case 10.

Microcontroller circuitry 32 incorporates capacitive sensing circuitry which is electrically connected to the case 10 by enclosure contact clips 26. Contact by a human finger, hand, or other conductive object with the closed distal end cap 12 of the case 10 varies the base capacitance of the case 10 and generates a contact signal within the microcontroller circuitry 32 in a manner fully explained below. When the microcontroller circuitry 32 acknowledges the contact signal and receives the control signal from the piezo signal conditioning circuitry 18, the microcontroller circuitry 32 selectively instructs output switch circuitry 34 to provide either an active or an inactive current sink at interface terminal 28. The microcontroller circuitry 32 selection of active or inactive current sink is more fully explained below.

The microcontroller circuitry 32 and piezo signal conditioning circuitry 18 are both powered by power supply circuitry 30. The operation of the power supply circuitry 30 is more fully explained below.

Figure 2:
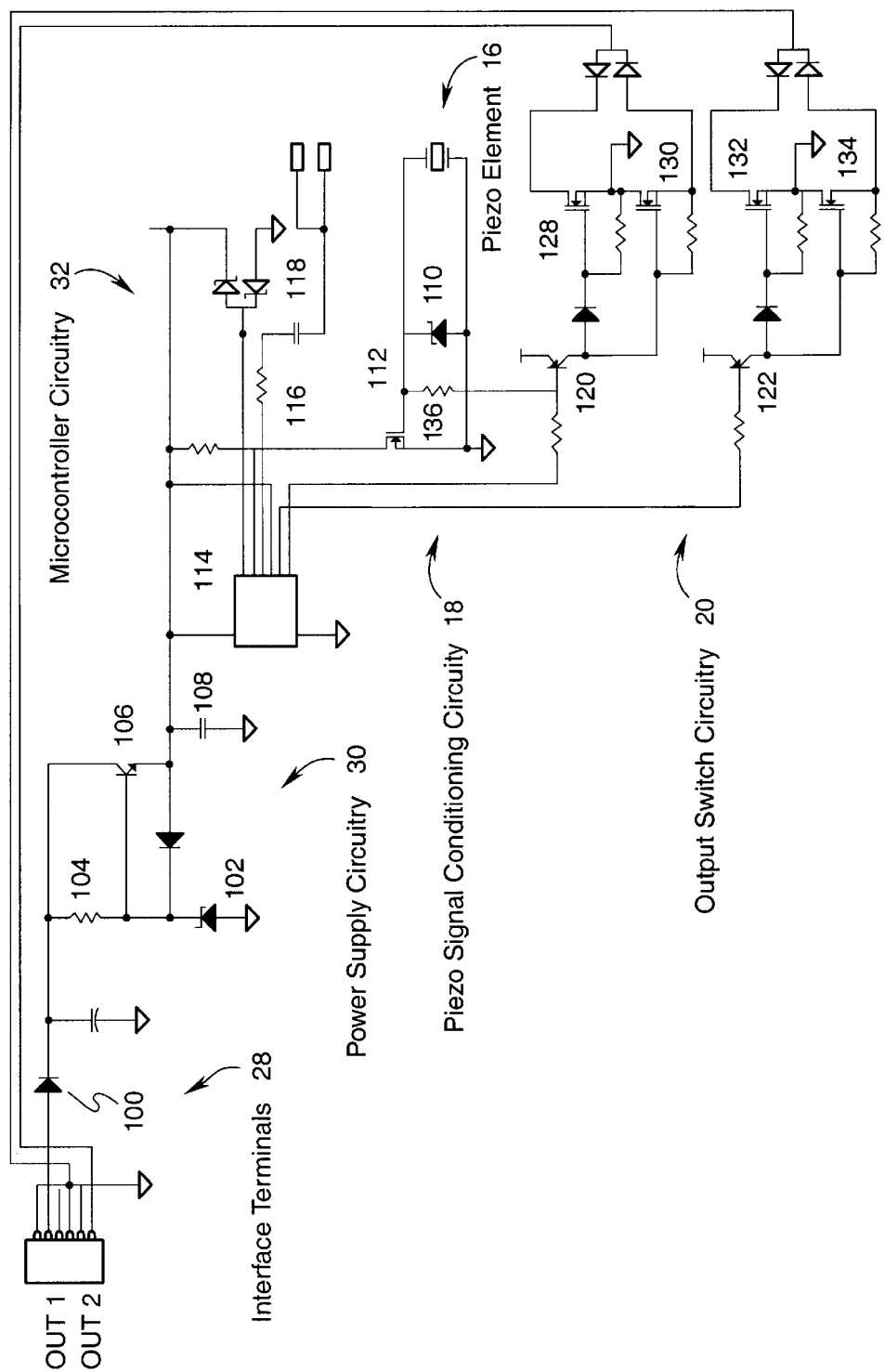
FIG. 2 is a schematic diagram of the circuitry of the embodiment of the present invention shown in FIG. 1.

FIG. 2 is a schematic diagram of the interface terminal 28, power supply circuitry microcontroller circuitry 32, piezo signal conditioning circuitry 18, and output switch circuitry 34. The interface terminal 28 possesses six interface pins. Power supply circuitry 30 is supplied external voltage, direct current or alternating current, through interface terminal 28 pin number two. Series diode 100 conducts only the positive component of the input waveform and the positive peak of the unregulated input voltage is then held by capacitor C1. Zener diode 102, biased by resistor 104, provides a stable reference voltage to the base of transistor Q106. Load current to power the microcontroller circuitry flows from C1 through the collector of transistor Q106, where the voltage is dropped to a steady five volts at the emitter of Q106. Capacitor C108 then provides high frequency decoupling for the microcontroller power supply.

Piezo signal circuitry 18 comprises piezoelectric element 16 in parallel with load resistor 136 and spike arrest zener diode 110. Output voltage derived from bending the piezoelectric element 16 turns on transistor 112 dropping input potential to the microcontroller circuitry 32 from its normally high state (VDD) to low (gnd/RTN), thereby indicating pressure applied to distal closed end 12 of the case 10.

Microprocessor 114 generates an oscillating output waveform at microprocessor 114 pin number five which is received by microprocessor 114 pin number seven through resistor 116. When the switch is untouched, capacitor 118 leaves the output waveform unaffected. When contact is made with the switch such as human contact, the capacitance of the case 10 increases. The increased capacitance appears in series with capacitor 118 through enclosure contact clips 26. The combined capacitance phase shifts the oscillating output waveform as the waveform is received at microprocessor 114 pin number seven. The microprocessor 114 is internally programmed to recognize this phase shift as contact with the closed distal end cap 12 of the case 10. The microprocessor 114 can be programmed to recognize any range of capacitive change to increase or decrease the actuation contact requirement for a corresponding range of switch sensitivity. While the preferred embodiment utilizes capacitive sensing circuitry to sense contact with the case, the invention broadly contemplates other presence sensing devices which may not require contact with the case. Such presence sensing devices may include photovoltaic cells in which an object interferes with the light detection of the cell, magnetic or electromagnetic field detection circuitry which can sense a change in magnetic or electromagnetic fields induced by proximate objects, temperature sensing means which senses change in temperature due to proximate objects, or any other similar presence sensing devices.

When microprocessor 114 receives a low signal from piezo signal conditioning circuitry 18 and recognizes contact with the closed distal end cap 12 of the case 10, the microprocessor 114 produces two output signals at microprocessor 114 pins four and five, one constant and the other a pulse of five hundred millisecond duration. The five hundred millisecond signal can be used for a variety of purposes, for example, to create an audible signal which indicates switch actuation. As the invention is not limited to these particular output signals, the microprocessor can be programmed to generate a variety of other outputs signals of varying duration or to output waveforms in response to recognition of the two conditions precedent. The output signals are transmitted to identical circuits within output switch circuitry 34. While the preferred embodiment utilizes a microprocessor, the invention contemplates other determining means such as linear logic circuitry or discrete circuitry.

The preferred embodiment utilizes output switch circuitry to provide current-sink outputs which are transmitted through the interface terminals to external electronic equipment. The invention is broad enough, however, to contemplate a switch providing actual electrical continuity between two or more electrical nodes, or the output of waveforms or various signals responsive to satisfaction of the two predetermined conditions precedent. To provide current-sink switch capability, transmitted output signals from the microprocessor 114 are received at the gates of transistors 120 and 122 across resistors 124 and 126 respectively. High transmitted output signals turns off transistors 120 and 122 which, in turn, turns off transistors 128, 130, 132, and 134. When transistors 128, 130, 132, and 134 are off, electrical discontinuity exists between interface terminal 28 output pin numbers one and three and ground/RTN. This "inactive current-sink" state is recognized by external circuitry to be the electrical equivalent of an "open" circuit. Low transmitted output signals turns on transistors 120 and 122 which in turn turns on transistors 128, 130, 132, and 134. With transistors 128, 130, 132, and 134 on, electrical continuity exists between interface terminal 28 output pin number 6 and ground/RTN, and between interface terminal 28 output pin number 4 and ground/RTN, allowing AC or DC current to flow through each circuit. This "active current-sink" state is recognized by external circuitry to be the electrical equivalent of a "closed" circuit.

While the preferred embodiment described in FIGS. 1 and 2 and explained above show an electric switch case 10 within which all circuitry is self contained, the invention should not be so limited. Variations of the invention are possible whereby all or some of the elements and circuitry described are electrically interconnected but separate from the body of the switch. Such variations would allow for installation in locations where a self contained switch may be impractical.

Figure 3:
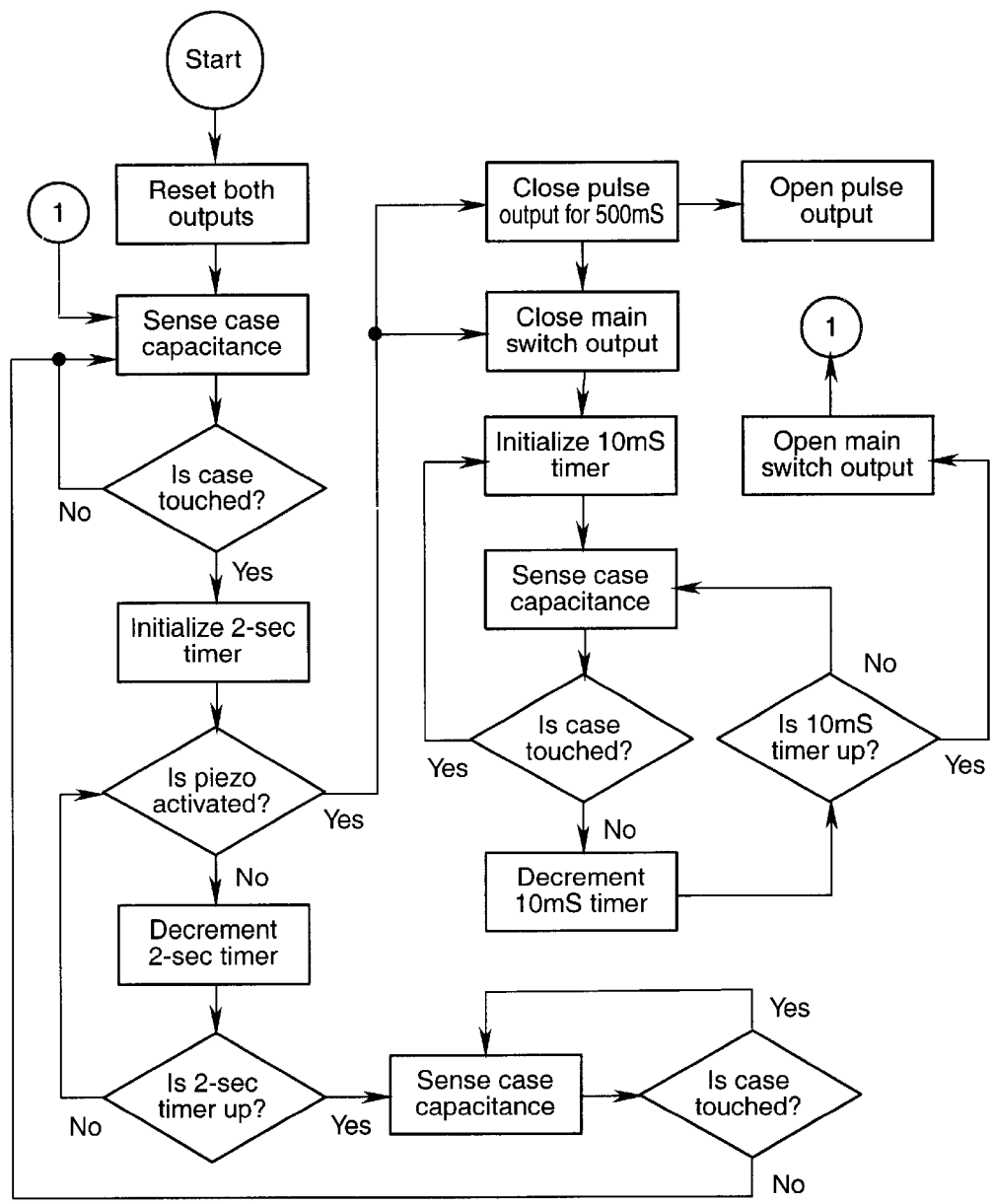
FIG. 3 is a flow diagram of the operation of the embodiment of the present invention shown in FIG. 1 and 2.
Figure 4:
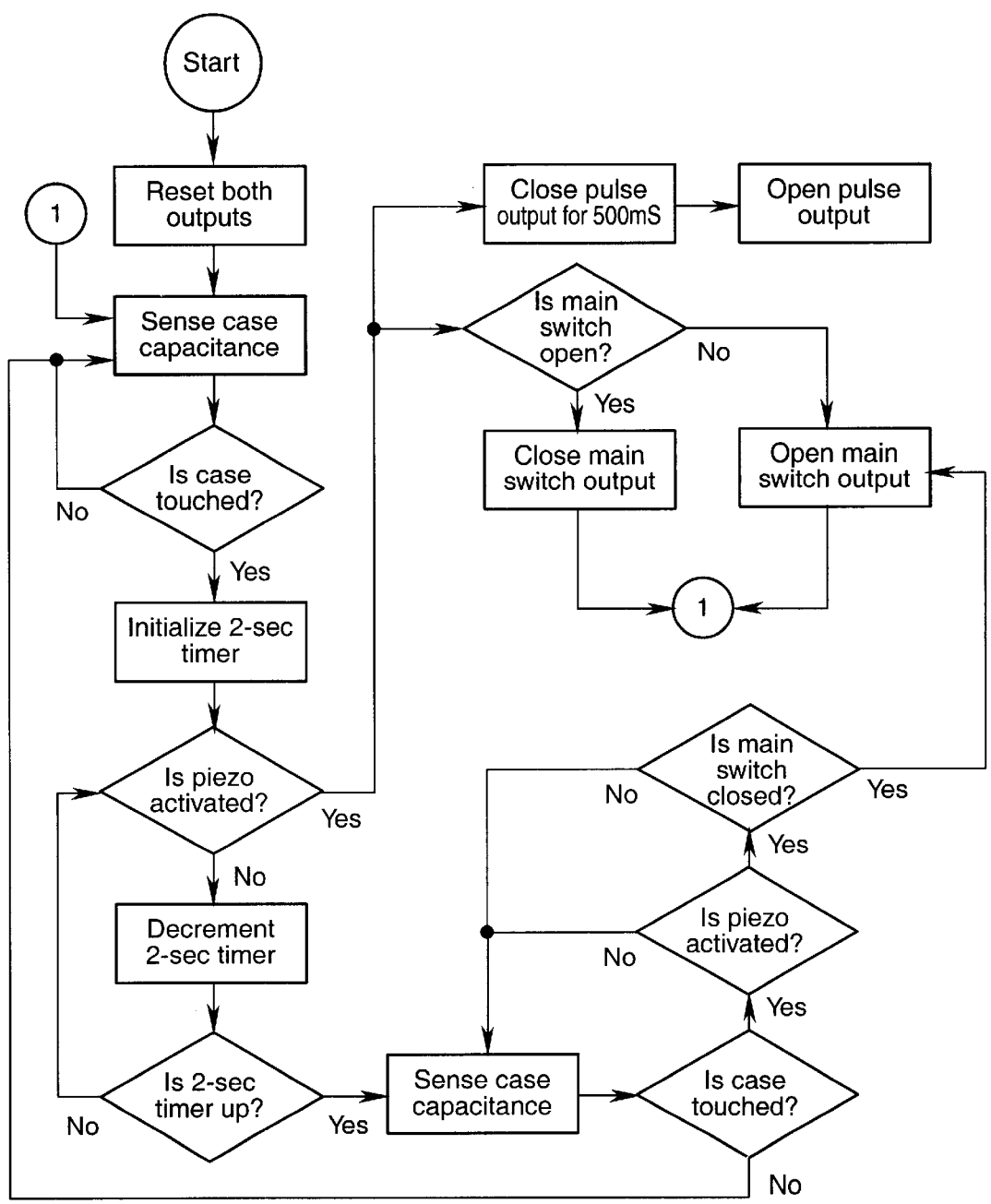
FIG. 4 is a logic flow diagram of the operation of another embodiment of the present invention.

FIGS. 3 and 4 shows the microprocessor's operational flow for two embodiments of the electrical switch. In FIG. 3, interface terminal 26 output pins one and three begin in a default "open" or "inactive current-sink" state. When the case 10 is touched as described above, the microprocessor 114 senses a change in the case's 10 capacitance as described previously and initializes a two second timer. If within the two second period, the piezo signal conditioning circuitry 18 is activated by pressure as previously described, the microprocessor 114 sets interface terminal 28 output pin one to the "closed" or "active current-sink" state and interface terminal 28 output pin three to the "closed" or "active current-sink" state for five hundred milliseconds and then resets interface terminal 28 output pin three to the "open" or "inactive current-sink" state. The microprocessor 114 then initializes a ten millisecond timer. If within ten milliseconds, the case's 10 capacitance returns to its initial value due to removal of contact with the case 10, the terminal 28 output pin remains in the "closed" or "active current-sink" state until the ten millisecond time period is over. If the case's 10 capacitance indicates touch contact has returned prior to the end of the ten millisecond period, the terminal 28 output pin one remains in the "closed" or "active current-sink" state, and the microprocessor 114 reinitializes the ten millisecond timer, thereby monitoring the switch every ten milliseconds until the case 10 is released. In this way, the ten millisecond timer allows inadvertent removal of touch contact with case 10 without resetting terminal 28 output pin one to an "open" or "inactive current-sink" state. This is a method of providing a switch "debounce". If the case's 10 capacitance remains at its initial value at the end of the ten millisecond period, indicating that contact with the case 10 has been removed, the microprocessor 114 resets terminal 28 output pin one to an "open" or "inactive current-sink" state. This embodiment therefore, provides current-sink output for the duration that the electrical switch's closed distal end cap 12 of the case 10 is pressed. Again, the invention is not limited to the particular timer durational increments mentioned above (two seconds and five-hundred milliseconds). Other timer increments can easily be programmed into the microprocessor 114 to alter the inventions sensitivity and speed.

An alternative embodiment shown in FIG. 4 utilizes the microprocessor 114 to alternate setting interface terminal 28 pin 1 to the "open" and "closed" states upon satisfaction of the two conditions precedent described in detail above. The default state is, therefore, unimportant. When the case 10 is touched as described above, the microprocessor 114 initializes a two second timer. If within the two seconds the piezo conditioning circuitry 18 sends a pressure signal as described above, the microprocessor 114 sets interface terminal 28 pin 3 to the "closed" or "active current-sink" state for five hundred milliseconds and then resets interface terminal 28 pin 3 to the "open" or "inactive current-sink" state. At the same time, the microprocessor senses whether interface terminal 28 pin 1 is in the "closed" or "open" state and sets the output to the opposite state. In this embodiment, therefore, the electrical switch's output current-sink will toggle between active and inactive with each individual contact with the closed distal end cap 12 of the case 110. The invention is not limited to the two second timer duration mentioned above. Other timer increments can easily be programmed into the microprocessor 114 to alter the inventions sensitivity and speed.

While the above are important features of the invention, there are, of course additional features of the invention that will form the subject matter of the claims appended hereto. In this respect, it is to be understood that the invention is not limited in its application to the details of construction and to the arrangements of the components set forth in the previous description or illustrated in the drawings. The invention is capable of other embodiments and of being practiced and carried out in various ways. Also it is to be understood that the phraseology and terminology employed herein are for the purpose of description and should not be regarded as limiting. As such, those skilled in the art will appreciate that the conception, upon which the disclosure is based, may readily be utilized as a basis for the designing of other structures, methods, or systems for carrying out the several purposes of the present invention. It is important, therefore, that the claims be regarded as including such equivalent constructions insofar as they do not depart from the spirit and scope of the present invention.

The invention is illustrated with respect to specific embodiments thereof. Though numerous characteristics and advantages are set forth in the foregoing description, together with details of the structure and function of the invention, the disclosure is illustrative only. Changes may be made in detail, especially in matters of materials, shape, size, and arrangement of parts within the principles of the invention to the full extent indicated by the broad general meaning of the terms in which the appended claims are expressed. Various modifications and additions may be made and will be apparent to those skilled in the art. Accordingly, the invention should not be limited by the foregoing description in any manner, but rather should be defined only by the following claims.

What is claimed is:

1. An electrical switch comprising:
   a switch actuation surface adapted to receive an object pressed thereagainst;
   pressure sensing means for sensing the condition of an object being pressed against said switch actuation surface;
   pressure sensing signal means for generating a pressure sensing electrical signal in response to said pressure sensing means sensing said pressed against condition;
   presence sensing means for sensing the presence of said object in the vicinity of said switch actuation surface;
   presence sensing signal means for generating a presence sensing electrical signal in response to said presence sensing means sensing the presence of said object in the vicinity of said switch actuation surface;

determining means responsive to both said pressure sensing signal means and to said presence sensing signal means for determining whether said pressure sensing electrical signal is generated within a predetermined time interval of which said presence sensing electrical signal is generated; and means responsive to said determining means for generating an electric switch output signal if said determining means determines that said pressure sensing signal is generated within said predetermined time interval.

2. An electrical switch according to claim 1 wherein said pressure sensing means includes a piezoelectric element.

3. An electrical switch according to claim 1 wherein said presence sensing means includes a photovoltaic cell in which a light beam is interrupted by said object.

4. An electrical switch according to claim 3 wherein said presence sensing means includes an electrically conductive medium and capacitive sensing means for sensing a capacitive change in said conductive medium.

5. An electrical switch according to claim 4 wherein said switch actuation surface includes said conductive medium.

6. An electrical switch according to claim 5 wherein said pressure sensing means includes a piezoelectric element.

7. An electrical switch according to claim 4 wherein said pressure sensing means includes a piezoelectric element.

8. An electrical switch according to claim 3 wherein said pressure sensing means includes a piezoelectric element.

9. An electrical switch according to claim 1 wherein said determining means determines whether said pressure sensing electrical signal is generated within a predetermined time interval after said pressure sensing signal is generated.

10. An electrical switch comprising:
an electrically conductive casing, at least one piezoelectric element, a microcontroller, whereby said casing supports said piezoelectric element, whereby said microcontroller is electrically connected to said casing to sense a change in said casing's capacitance above a predetermined threshold caused by contact with a conductive object, whereby said microcontroller is electrically connected to said piezoelectric element to sense a change in said piezoelectric element's voltage caused by pressure applied to said piezoelectric element, whereby said microcontroller opens or closes said electrical switch in response to sensing a change in said casing's capacitance above a predetermined threshold and sensing a change in said piezoelectric element's voltage.

11. An electrical switch according to claim 10 wherein said microcontroller includes a timer for monitoring time of a preselected duration whereby if said microcontroller senses a change in said casing's capacitance above a predetermined threshold said microcontroller initiates said timer and if said microcontroller senses a change in said piezoelectric element's voltage prior to the expiration of said predetermined timer duration, said microcontroller opens or closes said electrical switch.

12. An electrical switch according to claim 10 wherein said microcontroller produces an output pulse of a predetermined duration when said microcontroller opens or closes said electrical switch in response to sensing a change in said casing's capacitance above a predetermined threshold and sensing a change in said piezoelectric element's voltage.

13. An electrical switch according to claim 10 wherein said timer's preselected duration is between 0.1 and 2.5 seconds.

14. An electrical switch according to claim 10 wherein said piezoelectric element is electronically connected to said microcontroller by a flexible leadless connector.

15. An electrical switch according to claim 10 wherein said microcontroller is mounted within said casing.

16. An electrical switch according to claim 10 possessing internal power supply circuitry.

17. An electrical switch according to claim 10 which provides switch closure for the duration that pressure is provided to said piezoelectric element and an object is in contact with said casing.

18. An electrical switch according to claim 10 which alternates between switch closure and opening each instance pressure is provided to said piezoelectric element and an object is in contact with said casing.

19. An electrical switch, comprising:
a cylindrical electrically conductive casing with a length, two opposing open distal ends, an exterior surface and an interior chamber formed from said interior surface;

a flexible cap mounted over one of said distal open ends with a surface accessible to pressure input and a second inner surface opposite said first surface facing said interior of said chamber;

a support frame mounted within said interior of said chamber in contact with said cap's second inner surface;

at least one piezoelectric element mounted in said support frame within said interior of said chamber with a contact surface to receive transmitted pressure input from said cap and an opposing voltage transmission surface;

piezoelectric signal conditioning circuitry mounted within said interior of said chamber and electrically connected to said piezoelectric element's voltage transmission surface;

capacitive sensing circuitry mounted within said interior of said chamber;

power supply circuitry mounted within said interior of said chamber;

a microcontroller mounted within said interior of said chamber electrically connected to said piezoelectric signal conditioning circuitry and electrically connected to said capacitive sensing circuitry and driven by said power supply circuitry;

switch circuitry mounted within said interior of said chamber electrically connected to and controlled by said microcontroller outputs;

interface terminals electrically connected to said switch circuitry and extending through said second distal end of said electrically conductive casing to said exterior of said electrically conductive casing.

20. An electrical switch according to claim 19 wherein said cap is incorporated into said electrically conductive casing.

21. An electrical switch according to claim 19 wherein said piezoelectric element's voltage transmission surface is electronically connected to said microcontroller by a flexible leadless connector.

22. An electrical switch according to claim 19 wherein said microcontroller, capacitive sensing circuitry, and switch circuitry are mounted on at least one printed circuit board.

23. An electrical switch according to claim 19 which provides switch closure for the duration that pressure is provided to said piezoelectric element and an object is in contact with said casing.

24. An electrical switch according to claim 19 which alternates between switch closure and opening each instance that pressure is provided to said piezoelectric element and an object is in contact with said casing.

25. An electrical switch comprising:

an electrically conductive casing;

pressure input sensing means for generation of a pressure presence signal when pressure is exerted on the exterior of said electrically conductive casing;

proximity detecting means for generation of a contact signal when an object comes into contact with the exterior of said electrically conductive casing;

detection means for acknowledging concurrent existence of said pressure presence signal and said contact signal;

control means being responsive to said detection means and operative to provide switch opening or closure.

26. An electrical switch according to claim 25 wherein said control means provides switch closure for the duration of the existence of said pressure presence signal and said contact signal.

27. An electrical switch according to claim 25 wherein said control means alternates between switch opening and closure upon each individual instance that said pressure presence signal and said contact signal concurrently exist.

28. An electrical switch according to claim 25 wherein said pressure input sensing means comprises a piezoelectric element.

29. A method of opening and closing an electrical switch comprising the steps of:

(a) sensing the input of pressure on an electrical switch;

(b) sensing the presence of an object in contact with an electrical switch;

(c) sensing whether electrical switch is closed;

(d) opening the electrical switch if the electrical switch is closed and pressure was applied concurrently with an object contacting the electrical switch;

(e) closing the electrical switch if the electrical switch is open and pressure was applied concurrently with an object contacting the electrical switch.

30. The method of claim 29 wherein step (b) occurs prior to step (a).

31. The method of claim 29 wherein step (a) and step (b) occur simultaneously.

32. A method of opening or closing an electrical switch comprising the steps of:

(a) sensing the input of pressure on an electrical switch;

(b) sensing the presence of an object in contact with an electrical switch;

(c) closing the electrical switch if pressure was applied concurrently with an object contacting the electric switch;

(d) monitoring the continual contact of the object in contact with the electrical switch;

(e) opening the electrical switch when the object in contact with the electrical switch is removed.

33. The method of claim 32 wherein step (b) occurs prior to step (a).

34. The method of claim 32 wherein step (a) and step (b) occur simultaneously.

* * * * *